US008154410B2

(12) United States Patent  (10) Patent No.: US 8,154,410 B2
Baba  (45) Date of Patent: Apr. 10, 2012

(54) RADIO FREQUENCY TAG AND METHOD FOR MANUFACTURING RADIO FREQUENCY TAG

(75) Inventor: Shunji Baba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1021 days.

(21) Appl. No.: 12/035,858

(22) Filed: Feb. 22, 2008

(65) Prior Publication Data

US 2008/0204196 A1    Aug. 28, 2008

(30) Foreign Application Priority Data

Feb. 22, 2007   (JP) ................. 2007-042191

(51) Int. Cl.
    *G08B 13/14* (2006.01)
(52) U.S. Cl. ............... 340/572.8; 340/572.7; 340/572.1; 235/488
(58) Field of Classification Search .......... 235/492, 235/488; 340/10.1, 572.1, 572.7, 572.8; *G06K 19/00, 19/077; H05K 1/02, 1/03*
    See application file for complete search history.

(56) References Cited

U.S. PATENT DOCUMENTS

| 6,716,665 | B2 | 4/2004 | Baba et al. |
| 6,770,319 | B2 | 8/2004 | Baba et al. |
| 2005/0168339 | A1 | 8/2005 | Arai et al. |

FOREIGN PATENT DOCUMENTS

| CN | 1655187 A | 8/2005 |
| EP | 977145 A2 | 2/2000 |
| EP | 1739597 A2 | 1/2007 |
| JP | 6-310874 A | 11/1994 |
| JP | 8-88448 A | 4/1996 |
| JP | 2000-311226 A | 11/2000 |
| JP | 2001-339125 A | 12/2001 |
| JP | 2001-351082 A | 12/2001 |
| JP | 2000-200332 A | 7/2002 |
| JP | 2003-41234 A | 2/2003 |
| JP | 2004-23210 A | 1/2004 |
| JP | 2005-056362 A | 3/2005 |
| JP | 2005-107882 A | 4/2005 |
| KR | 1020060041629 A | 5/2006 |
| KR | 20060095624 A | 9/2006 |

OTHER PUBLICATIONS

English Translation of Korean Publication 1020060095624.*
Korean Office Action dated Oct. 22, 2009, issued in corresponding Korean Patent Application No. 2006-95624 (Partial Translation).
European Search Report dated Jun. 13, 2008, issued in corresponding European Patent Application No. 08101123.1.

(Continued)

*Primary Examiner* — Benjamin C Lee
*Assistant Examiner* — Peter Mehravari
(74) *Attorney, Agent, or Firm* — Westerman, Hattori, Daniels & Adrian, LLP

(57) ABSTRACT

According to an aspect of an embodiment, a radio frequency tag comprising: a base; a radio frequency antenna disposed on the base; a circuit chip mounted on the base and electrically connected to the radio frequency antenna, the circuit chip performing radio communication via the radio frequency antenna; and a protection sheet disposed on the radio frequency antenna, the protection sheet comprising a flexible material and rigid bodies dispersed in the flexible material so as to prevent the protection sheet from being collapsed when the radio frequency tag is bent and compressed.

7 Claims, 12 Drawing Sheets

OTHER PUBLICATIONS

Korean Office Action dated May 29, 2010, issued in corresponding Korean Patent Application No. 10-2008-0014441.

Taiwan Office Action dated Jan. 28, 2011, issued in corresponding Taiwan Patent Application No. 097103066. (w/ partial English translation).

* cited by examiner

Fig. 23
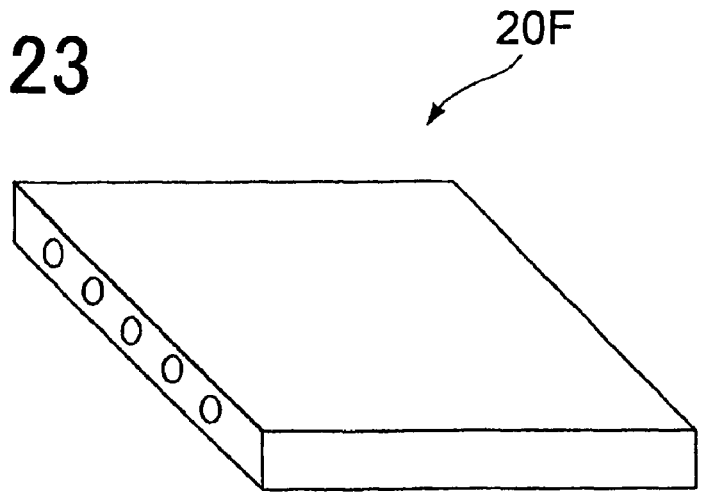
Fig. 24 Prior Art
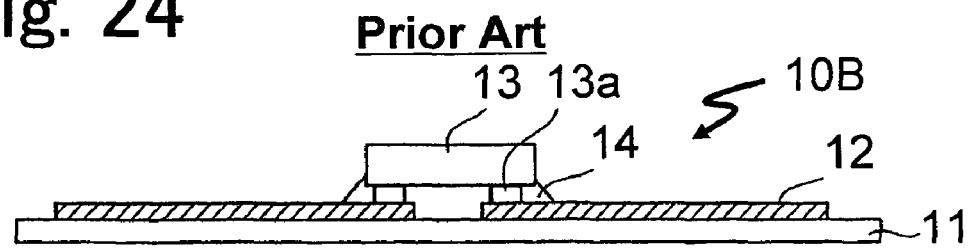
Fig. 25
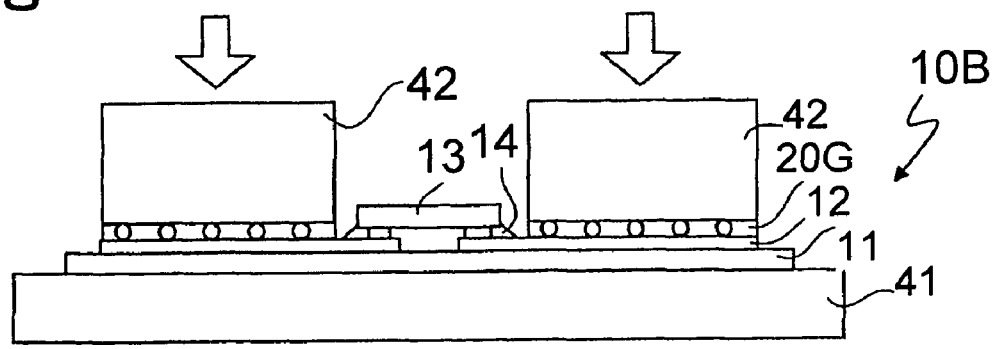

RADIO FREQUENCY TAG AND METHOD FOR MANUFACTURING RADIO FREQUENCY TAG

BACKGROUND OF THE INVENTION

1. Field of the Invention

The present invention relates to a technology for protecting an antenna of a radio-frequency identification (RFID) tag.

2. Description of the Related Art

RFID tags having antenna patterns and circuit chips mounted on plastic or paper base sheets have been proposed. Due to being bendable, an RFID tag of this type is advantageous in that it is readily mountable to an object.

However, the aforementioned RFID tag can be problematic in that the antenna may break in a case where the base sheet is excessively bent.

The following are patent documents related to RFID tags: Japanese Unexamined Patent Application Publication Nos. 2000-311226, 2000-200332, 2001-351082, 6-310874, 2001-339125, 8-88448, and 2003-41234.

SUMMARY

According to an aspect of an embodiment, a radio frequency tag comprising: a base; a radio frequency antenna disposed on the base; a circuit chip mounted on the base and electrically connected to the radio frequency antenna, the circuit chip performing radio communication via the radio frequency antenna; and a protection sheet disposed on the radio frequency antenna, the protection sheet comprising a flexible material and rigid bodies dispersed in the flexible material so as to prevent the protection sheet from being collapsed when the radio frequency tag is bent and compressed.

BRIEF DESCRIPTION OF THE DRAWINGS

FIG. 23 schematically illustrates a protection sheet manufactured using the manufacturing method shown in FIG. 22;

FIG. 24 schematically illustrates an RFID tag just prior to having a protection sheet attached thereto;

FIG. 25 schematically illustrates a step for attaching a protection sheet onto a front surface of the RFID tag formed to the state shown in FIG. 24;

DESCRIPTION OF THE PREFERRED EMBODIMENTS

Figure 1:
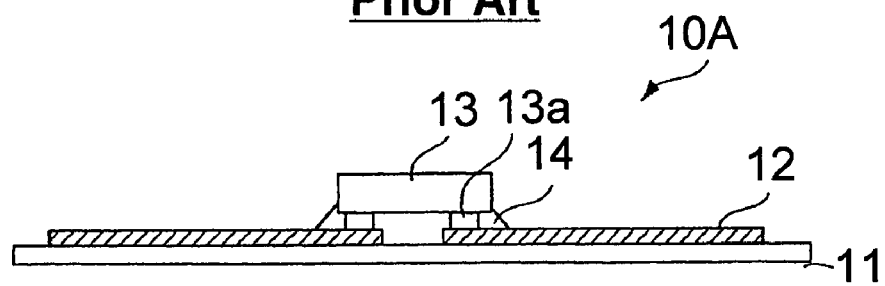
FIG. 1 is a schematic cross-sectional view showing an example of an RFID tag according to an embodiment of the present invention.

FIG. 1 is a schematic cross-sectional view showing an example of an RFID tag.

An RFID tag 10A includes a bendable base 11 formed of, for example, a polyethylene terephthalate (PET) film, an antenna 12 having a conductor pattern disposed on the base 11, and a circuit chip 13 disposed on the antenna 12. The circuit chip 13 has a connection terminal 13a on a lower surface thereof, which is electrically connected to the antenna 12 by, for example, soldering. A peripheral area surrounding the connection terminal 13a is fixed above the base 11 with an adhesive 14. The circuit chip 13 contains a circuit that can transmit information to and from an external device via the antenna 12.

As described above, the RFID tag can be problematic in that the conductor pattern of the antenna 12 can break when the base 11 is bent excessively.

Figure 2:
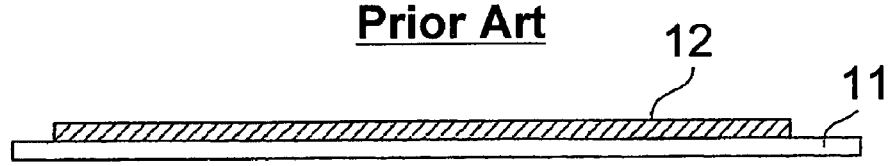
FIG. 2 schematically illustrates a problem in the RFID tag shown in FIG. 1 according to an embodiment of the present invention.
Figure 3:
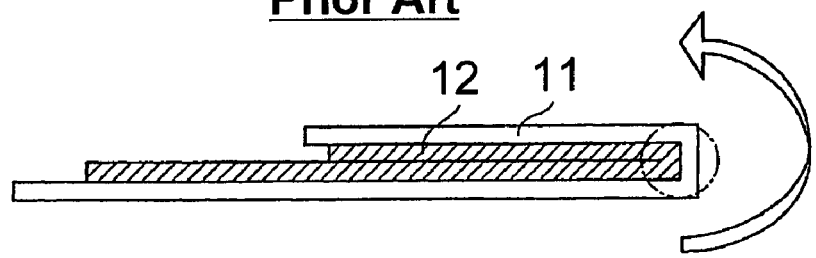
FIG. 3 also schematically illustrates the problem in the RFID tag shown in FIG. 1.

FIGS. 2 and 3 schematically illustrate this problem. FIG. 2 illustrates the RFID tag including the base 11 and the conductor pattern of the antenna 12 disposed on the base 11, and FIG. 3 illustrates the RFID tag shown in FIG. 2 in a bent state. In order to simplify the drawings, these figures only show the base 11 and the antenna 12, and the circuit chip 13 and the like have been omitted therefrom.

When the RFID tag shown in FIG. 2 is bent as in FIG. 3, a section of the antenna 12 disposed on the base 11, indicated with a dot-dash line in FIG. 3, is tightly folded back, which can possibly cause the antenna 12 to break.

Figure 4:
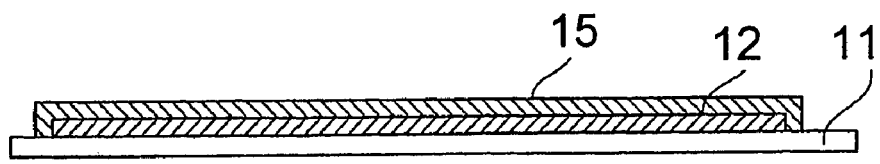
FIG. 4 illustrates a conventional countermeasure for preventing a conductor pattern of an antenna from breaking.
Figure 5:
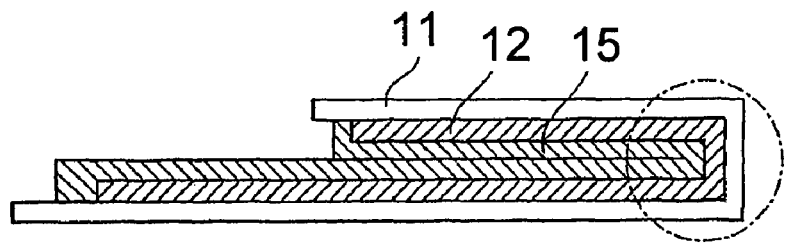
FIG. 5 shows the RFID tag shown in FIG. 4 in a state where a base thereof is bent, and indicates the problem in the RFID tag shown in FIG. 3.

FIG. 4 illustrates a conventional countermeasure for preventing the conductor pattern of the antenna from breaking. Unlike that shown in FIG. 2, the RFID tag shown in FIG. 4 has a flexible protection layer 15 of, for example, rubber disposed above the base 11 (antenna 12). Similar to the above, the circuit chip and the like have been omitted from the drawing. FIG. 5 shows the base of the RFID tag in FIG. 4 in a bent state.

Unlike the case in FIG. 3, the protection layer 15 prevents the antenna 12 from being bent to an extremely small radius of curvature. Therefore, the protection layer 15 serves as a cushion and reduces the possibility of breakage of the conductor pattern of the antenna 12 as compared to the case in FIG. 3.

Figure 6:
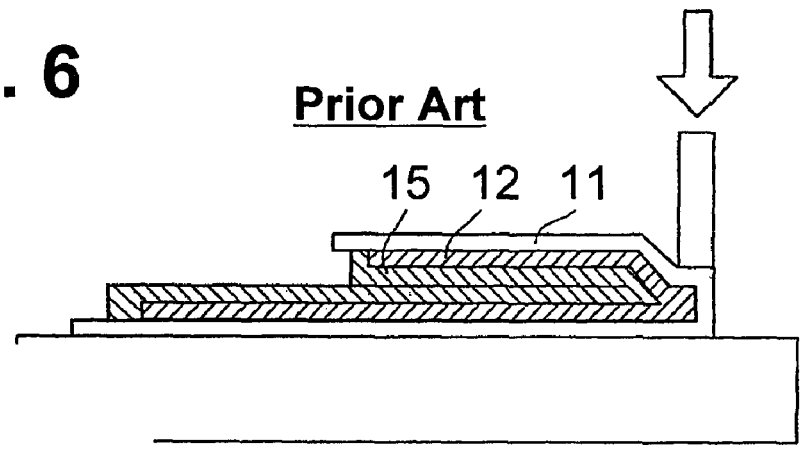
FIG. 6 illustrates a problem in the RFID tag shown in FIG. 5.

FIG. 6 illustrates a problem existing in the RFID tag shown in FIG. 5.

The RFID tag is laid on a table 61. Although the RFID tag shown in FIG. 5 is protected by the protection layer 15 to a certain extent, the protection layer 15 becomes deformed when a pressure portion 60 adds an excessive amount of concentrated load to the bent section as shown in FIG. 6. This can result in the conductor pattern of the antenna 12 to be bent to an extremely small radius of curvature, causing the antenna 12 to break.

In order to prevent the antenna 12 from breaking, the base 11 or the protection layer 15 may be given rigidity that prevents it from being excessively bent. In that case, however, the flexibility of the RFID tag will be lost, which could limit the intended use of the RFID tag or lead to bad usability of the RFID tag.

With regard to a flexible substrate, Japanese Unexamined Patent Application Publication No. 6-310874 proposes a flexible substrate having disposed thereon a screen sheet having the same function as the protection layer described with reference to FIG. 5, but still has the same problem as described above. Japanese Unexamined Patent Application Publication No. 2001-339125 proposes a flexible substrate provided with a spacer for regulating the radius of curvature of the bent section of the flexible substrate, but is not suitable for RFID tags. Japanese Unexamined Patent Application Publication No. 8-88448 proposes a flexible substrate provided with a reinforcement plate for limiting the degree of bending of the flexible substrate, but cannot be applied to a bendable RFID tag. Japanese Unexamined Patent Application Publication No. 2003-41234 proposes a flexible substrate composed of a selected material for preventing breakage, but has limitations.

Embodiments according to the present invention will be described below.

Figure 7:
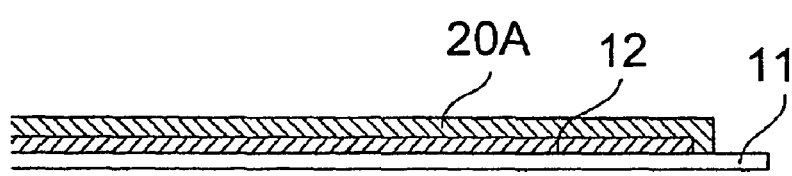
FIG. 7 shows a basic example of an RFID tag according to an embodiment of the present invention.

FIG. 7 shows a basic example of an RFID tag according to an embodiment of the present invention. Similar to the above, the circuit chip and the like have been omitted in order to simplify the drawing.

Similar to FIG. 4, FIG. 7 shows an antenna 12 having a conductor pattern disposed on a flexible base 11, and a sheet-like protection sheet 20A that covers the base 11 and the antenna 12. However, unlike the protection layer 15 shown in FIG. 4 composed of a flexible material such as rubber, the protection sheet shown in FIG. 7 has the following structure.

Figure 8:
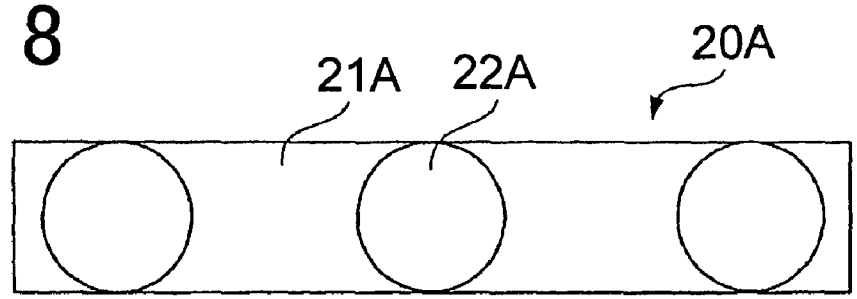
FIG. 8 is an enlarged cross-sectional view showing a portion of a protection sheet shown in FIG. 7.

FIG. 8 is an enlarged cross-sectional view showing a portion of the protection sheet 20A shown in FIG. 7.

The protection sheet 20A includes a flexible rubber sheet 21A and rigid balls 22A dispersedly embedded therein. As the rubber sheet 21A, for example, silicon rubber or urethane rubber may be used. As the rigid balls 22A, polycarbonate or polystyrene plastic or alumina ceramic may be used.

Figure 9:
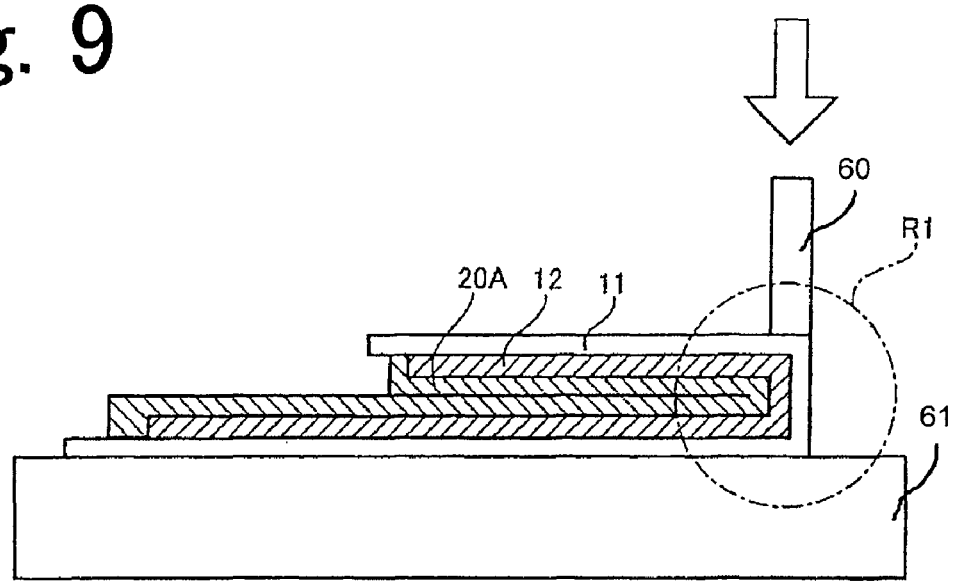
FIG. 9 illustrates the effect of the RFID tag equipped with the protection sheet shown in FIGS. 7 and 8.
Figure 10:
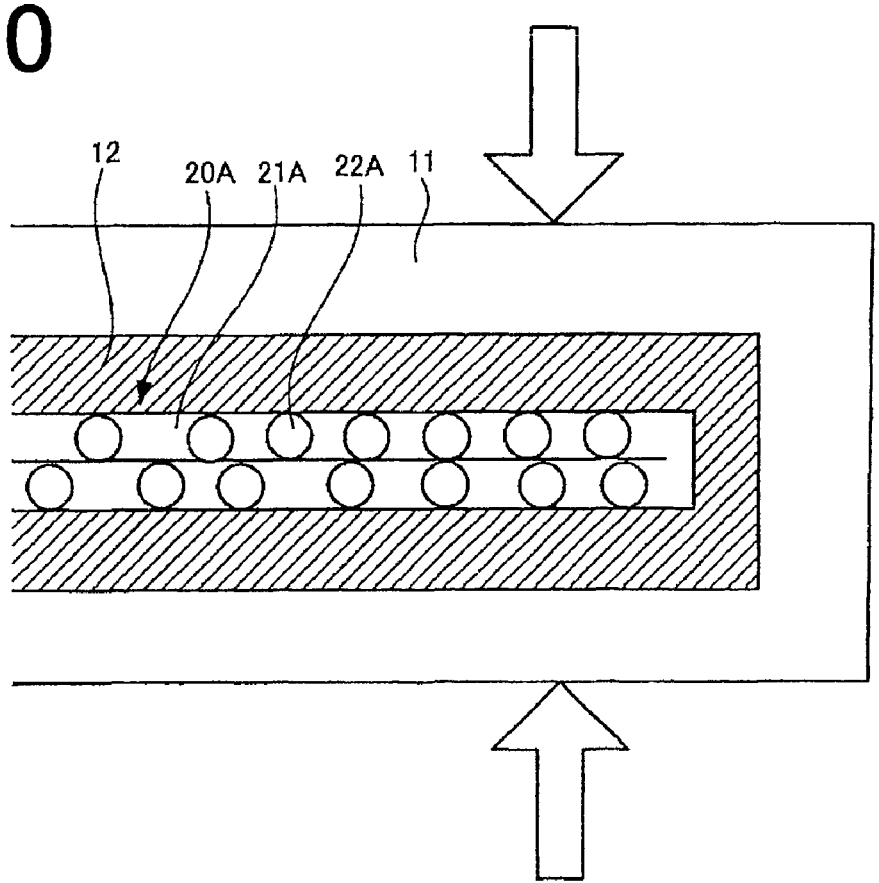
FIG. 10 is an enlarged view of a circled area R1 in FIG. 9.

FIG. 9 illustrates the effect of the RFID tag equipped with the protection sheet 20A described above with reference to FIGS. 7 and 8. FIG. 10 is an enlarged view of a circled area R1 in FIG. 9.

The protection sheet 20A has sufficient flexibility and can be bent to the state shown in FIG. 9.

In the bent state shown in FIG. 9, the RFID tag is laid on a table 61. Even when the pressure portion 60 adds an excessive amount of concentrated load to the bent section of the RFID tag, the rigid balls 22A dispersed in the protection sheet 20A abut against each other to prevent the protection sheet 20A from being compressed. As a result, the antenna 12 is prevented from being bent to an extremely small radius of curvature, thereby avoiding breakage of the antenna 12.

In the embodiment shown in FIGS. 7 to 10, although the protection sheet 20A is a first example of a protection sheet including the flexible rubber sheet 21A and the rigid balls 22A dispersedly disposed therein, other examples of protection sheets to be described below may be used as an alternative to the protection sheet 20A shown in FIGS. 7 to 10.

Figure 11:
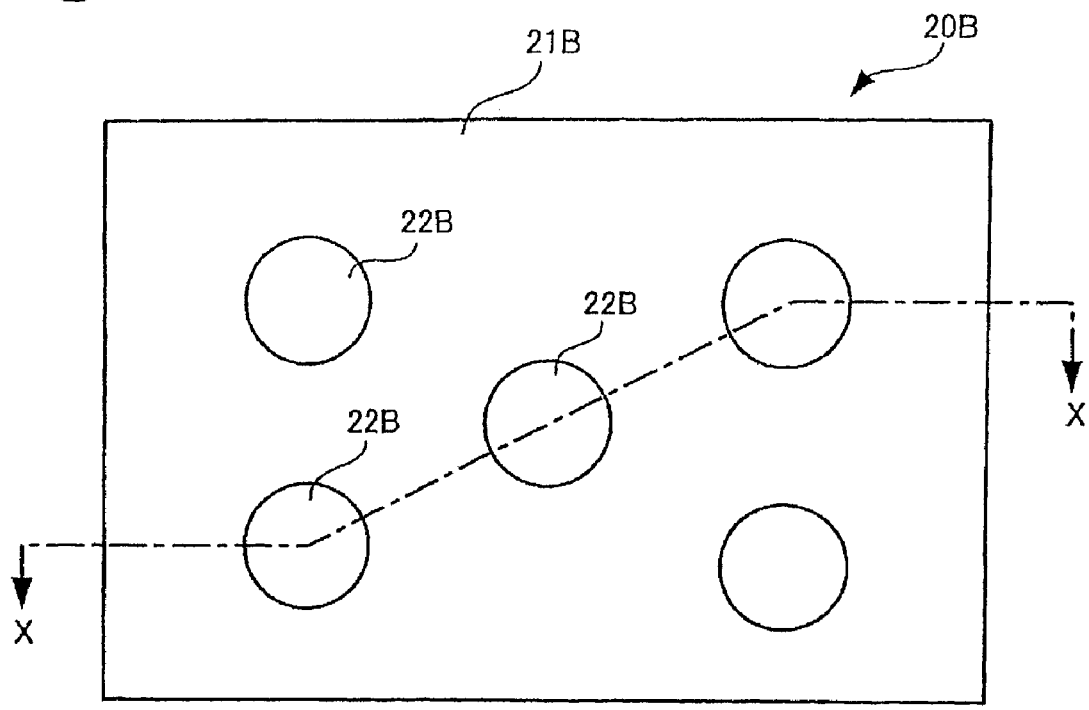
FIG. 11 is a plan view showing a second example of a protection sheet.
Figure 12:
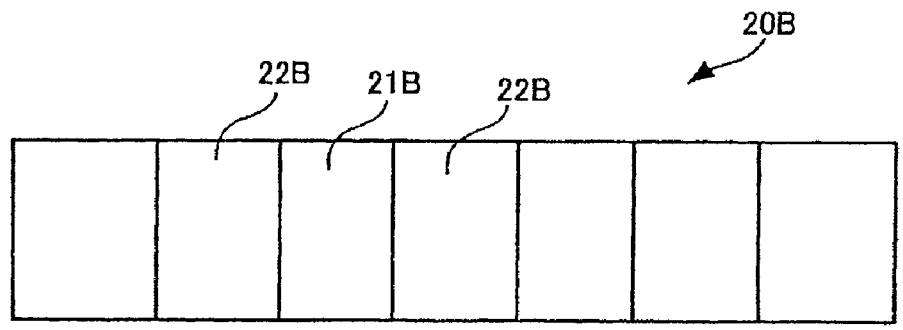
FIG. 12 is a cross-sectional view taken along line X-X in FIG. 11.

FIG. 11 is a plan view showing a second example of a protection sheet. FIG. 12 is a cross-sectional view taken along line X-X in FIG. 11.

A protection sheet 20B includes a flexible rubber sheet 21B and rigid cylindrical columns 22B dispersedly disposed therein. The rigid cylindrical columns 22B extend in the thickness direction of the sheet 21B.

With such a protection sheet 20B having the rigid cylindrical columns 22B dispersedly disposed therein, the protection sheet can be prevented from being compressed, thereby preventing the antenna 12 from breaking.

Figure 13:
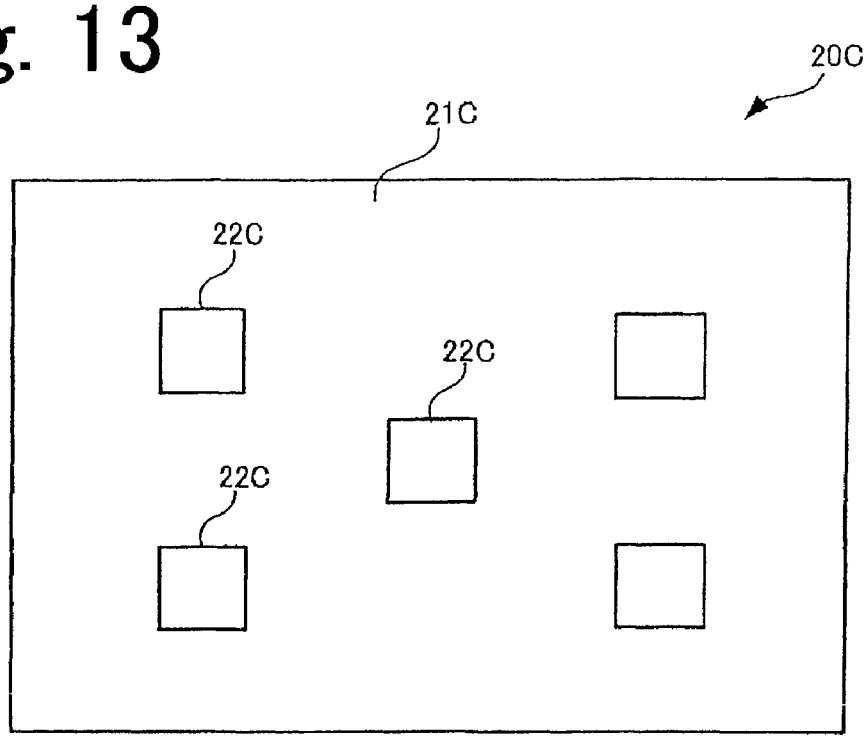
FIG. 13 illustrates a modified example of the protection sheet shown in FIGS. 11 and 12.

FIG. 13 illustrates a modified example of the protection sheet 20B described above with reference to FIGS. 11 and 12.

Unlike the protection sheet 20B shown in FIGS. 11 and 12 having the cylindrical columns 22B dispersedly disposed in the sheet 21B, a protection sheet 20C shown in FIG. 13 has rectangular columns 22C dispersedly disposed in a sheet 21C. Accordingly, the shape of the columns is not limited and may be, for example, cylindrical or rectangular.

Figure 14:
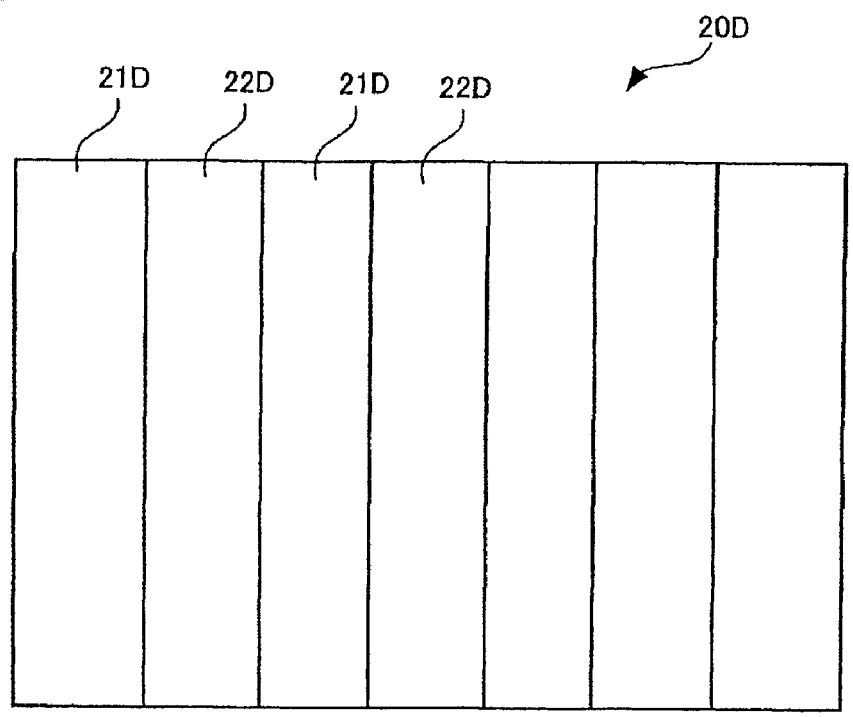
FIG. 14 is a plan view showing a third example of a protection sheet.
Figure 15:
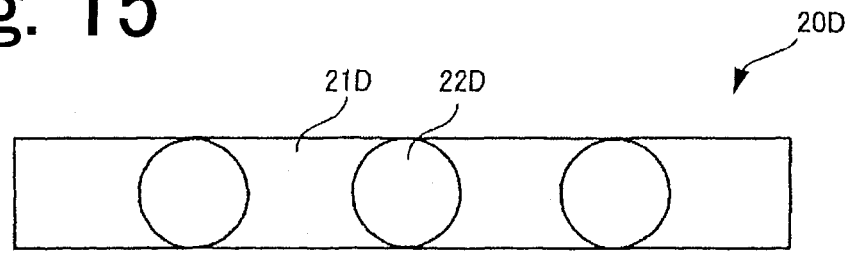
FIG. 15 is a cross-sectional view of the protection sheet shown in FIG. 14.

FIG. 14 is a plan view showing a third example of a protection sheet. FIG. 15 is a cross-sectional view of the protection sheet shown in FIG. 14.

A protection sheet 20D includes a flexible rubber sheet 21D and rigid wire rods 22D having a circular cross section and arranged in the sheet 21D. The wire rods 22D extend horizontally in an in-plane direction of the sheet 21D and are arranged in a one-dimensional direction (left-right direction in FIGS. 14 and 15).

The protection sheet 20D has flexibility in the left-right direction and is prevented from being compressed when bent. Thus, the flexibility of the RFID tag is assured while the protection sheet 20D is prevented from being compressed when bent, whereby the antenna 12 can be prevented from breaking.

Figure 16:
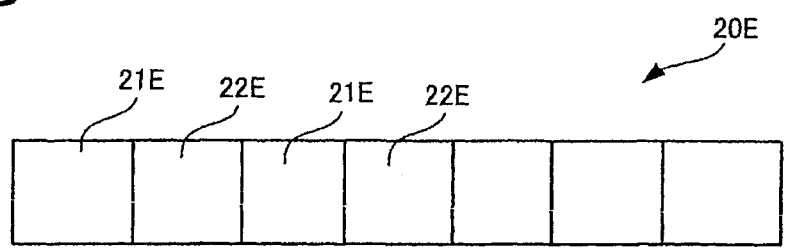
FIG. 16 illustrates a modified example of the protection sheet shown in FIGS. 14 and 15.

FIG. 16 illustrates a modified example of the protection sheet described above with reference to FIGS. 14 and 15.

Although the protection sheet 20D shown in FIGS. 14 and 15 has the wire rods 22D with a circular cross section arranged in the sheet 21D, a protection sheet 20E shown in FIG. 16 has wire rods 22E having a rectangular cross section arranged in a sheet 21E.

Accordingly, the wire rods may be circular or rectangular in cross section, and the cross-sectional shape thereof is not limited.

A method for manufacturing each type of protection sheet will be described below.

Figure 17:
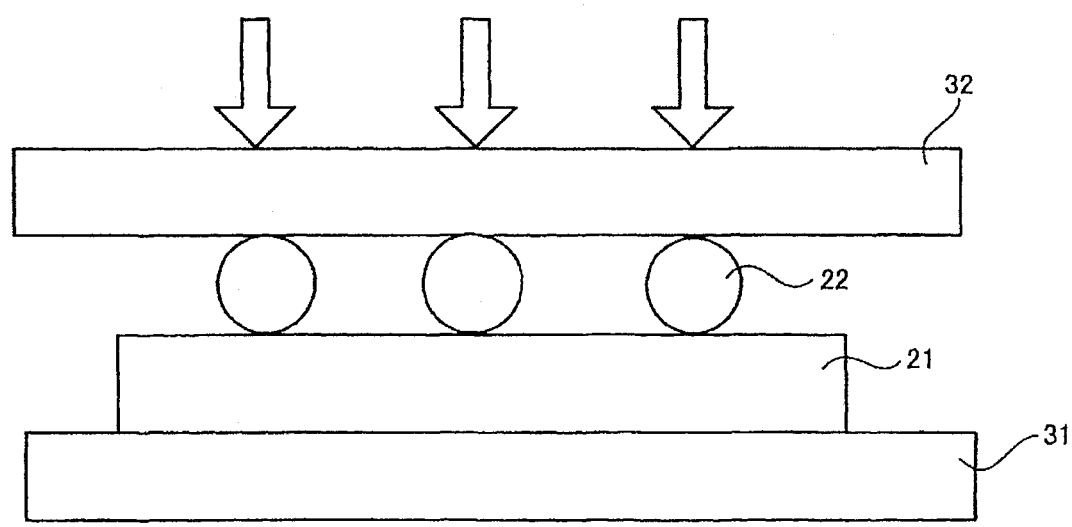
FIG. 17 schematically illustrates a first example of a method for manufacturing a protection sheet.
Figure 18:
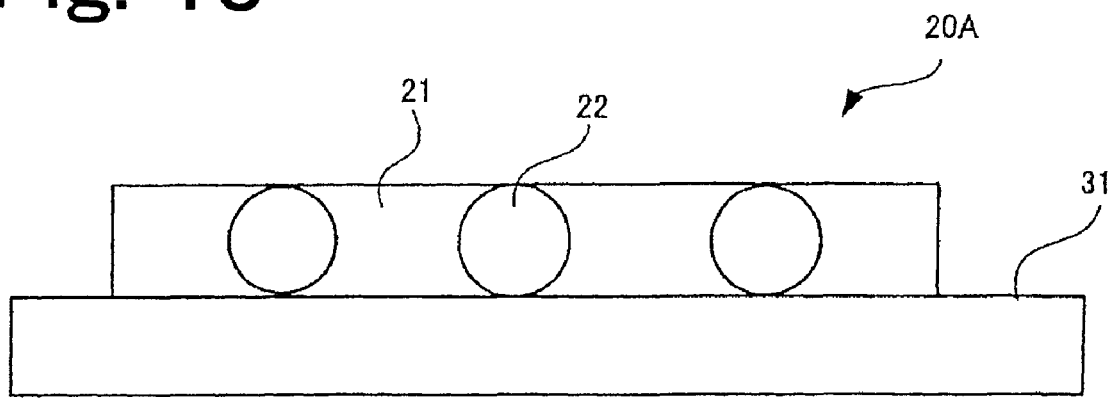
FIG. 18 is a cross-sectional view of a protection sheet manufactured using the method shown in FIG. 17.

FIG. 17 schematically illustrates a first example of a method for manufacturing a protection sheet. FIG. 18 is a cross-sectional view of a protection sheet manufactured using the method shown in FIG. 17.

First, a flexible rubber sheet 21 is placed on a heating stage 31, and rigid balls 22 are dispersedly disposed on the sheet 21. Then, a heater-presser head 32 is placed above the balls 22 so as to heat and apply pressure on the rigid balls 22. This allows the balls 22 to be embedded into the sheet 21, as shown in FIG. 18. Accordingly, a protection sheet 20A (see FIG. 8) with the balls 22 dispersedly disposed in the sheet 21 is manufactured.

Although the rigid balls 22 are dispersedly disposed on the sheet 21 in the above description, the balls 22 on the sheet 21 may be replaced by wire rods that extend orthogonal to the plane of the drawing. In that case, a protection sheet 20D as shown in FIGS. 14 and 15 is manufactured.

Figure 19:
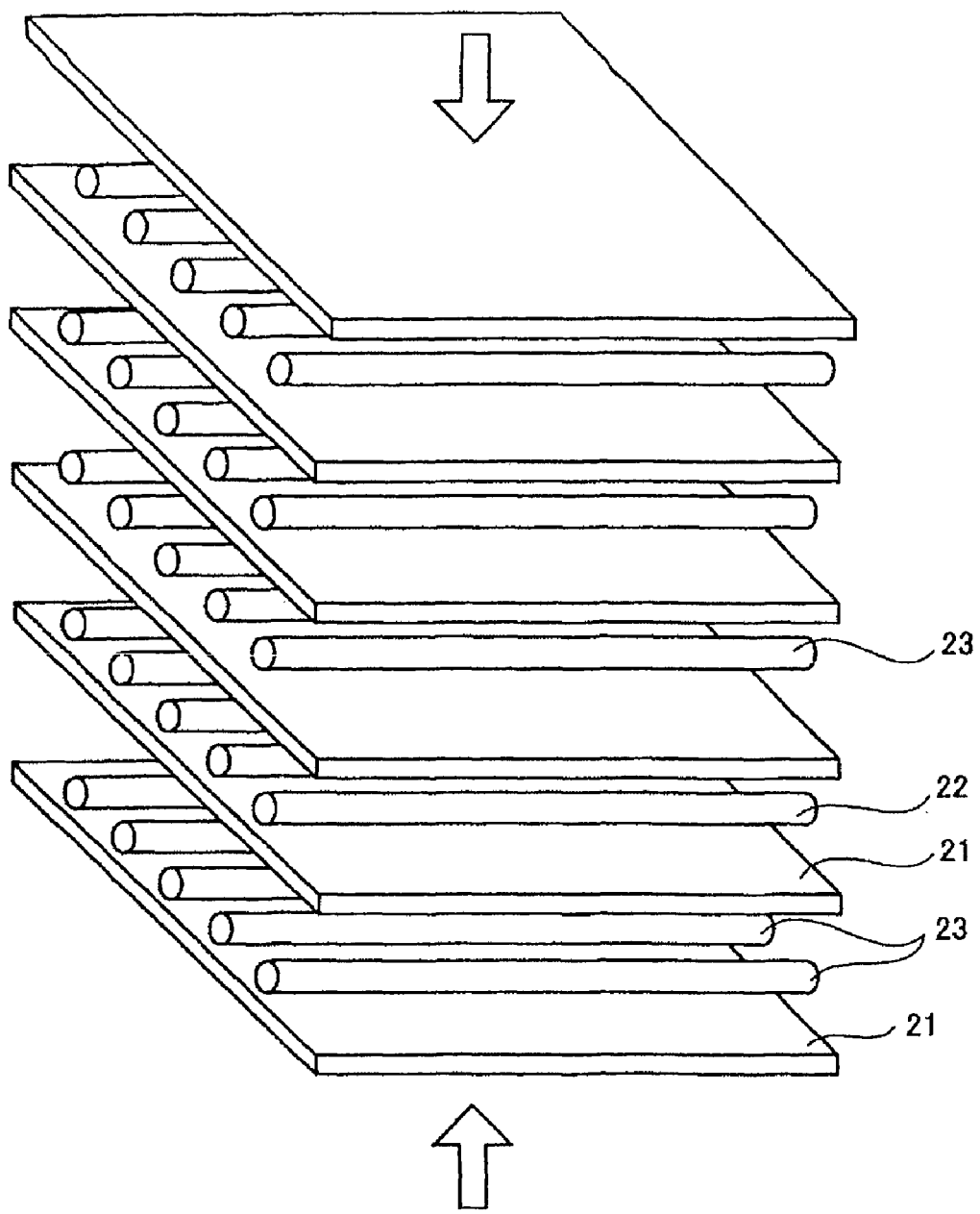
FIG. 19 schematically illustrates a second example of a method for manufacturing a protection sheet.
Figure 20:
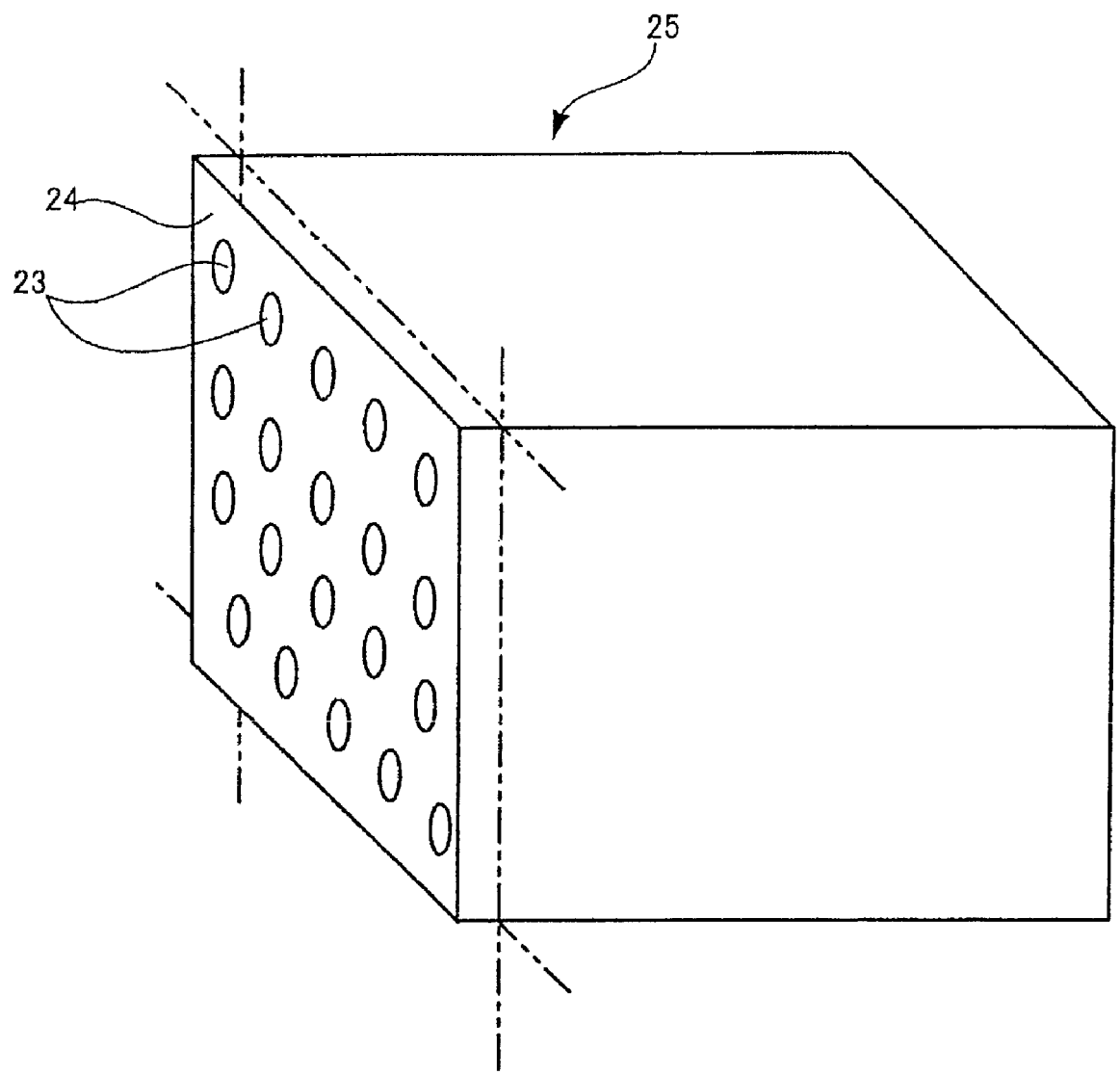
FIG. 20 schematically illustrates a fusion body constituted by a flexible body and rigid wire rods embedded therein.
Figure 21:
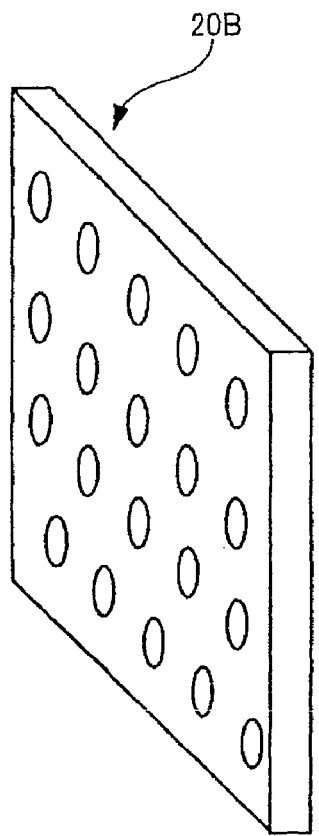
FIG. 21 schematically illustrates a protection sheet formed by cutting the fusion body shown in FIG. 20.

FIG. 19 schematically illustrates a second example of a method for manufacturing a protection sheet. FIG. 20 schematically illustrates a fusion body constituted by a flexible body and rigid wire rods embedded therein. FIG. 21 schematically illustrates a protection sheet formed by cutting the fusion body shown in FIG. 20.

Flexible rubber sheets 21 and layers of rigid wire rods 23 are alternately stacked above a heating stage (not shown). The wire rods 23 in each layer are arranged above a flexible sheet 21 in an in-plane direction of the flexible sheet 21 and in a one-dimensional direction. After stacking the flexible sheets 21 and the layers of wire rods 23 alternately in this manner, a heating head (not shown) is placed on the multilayer body to heat and apply pressure on the multilayer body. As shown in FIG. 20, this causes the flexible sheets 21 to become fused to each other, thereby forming a flexible body 24. In addition, a fusion body 25 having the wire rods 23 dispersedly arranged in multiple layers within the flexible body 24 is formed. Subsequently, the fusion body 25 is cut in a direction that intersects with the wire rods 23, whereby a protection sheet 20B (see FIGS. 11 and 12) having rigid columns dispersedly disposed in a flexible rubber sheet is formed, as shown in FIG. 21.

Although the fusion body 25 shown in FIG. 20 is cut in the direction that intersects with the wire rods 23 embedded therein to manufacture the protection sheet 20B shown in FIG. 21, the fusion body 25 shown in FIG. 20 may alternatively be cut in the extending direction of the wire rods 23. In that case, a protection sheet 20D as shown in FIGS. 14 and 15 can be formed.

Furthermore, although rigid wire rods 23 are used in FIGS. 19 to 21, rigid bodies having other shapes, such as rigid balls, may be dispersedly disposed as an alternative to the wire rods 23.

Figure 22:
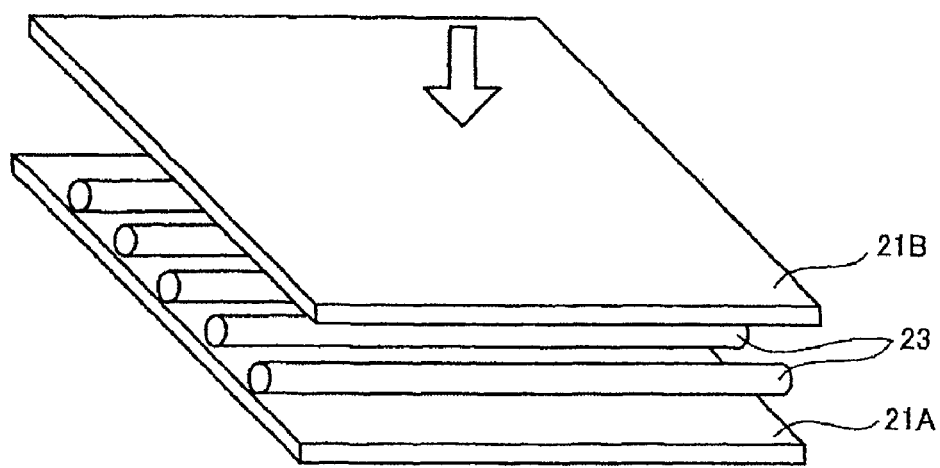
FIG. 22 schematically illustrates a third example of a method for manufacturing a protection sheet.

FIG. 22 schematically illustrates a third example of a method for manufacturing a protection sheet. FIG. 23 schematically illustrates a protection sheet manufactured using the manufacturing method shown in FIG. 22.

In this example, wire rods 23 are arranged on a flexible rubber sheet 21A, and another flexible rubber sheet 21B is disposed over the wire rods 23. The two flexible sheets 21A and 21B sandwich the wire rods 23 therebetween. This multilayer body is heated and pressurized, thereby forming a protection sheet 20F having the rigid wire rods embedded in the flexible sheets. This protection sheet 20F is similar to the aforementioned protection sheet 20D shown in FIGS. 14 and 15.

Although rigid wire rods 23 are used in this example, rigid bodies having other shapes, such as rigid balls, may be dispersedly disposed as an alternative to the wire rods 23.

Although the wire rods used in the examples of the manufacturing methods described above have a circular cross section, the wire rods may alternatively be rectangular in cross section.

An example where a protection sheet is applied to an RFID tag will be described below.

FIG. 24 schematically illustrates an RFID tag just prior to having a protection sheet attached thereto.

Similar to that in FIG. 1, an RFID tag 10B includes a bendable base 11 formed of, for example, a PET film, an antenna 12 having a conductor pattern disposed on the base 11, and a circuit chip 13 disposed on the antenna 12. The circuit chip 13 contains a circuit that can transmit information to and from an external device via the antenna 12. The circuit chip 13 has a connection terminal 13a on a lower surface thereof, which is electrically connected to the antenna 12 by, for example, soldering. A peripheral area surrounding the connection terminal 13a is fixed above the base 11 with an adhesive 14. A protection sheet is attached to the RFID tag 10B in the following manner.

Figure 26:
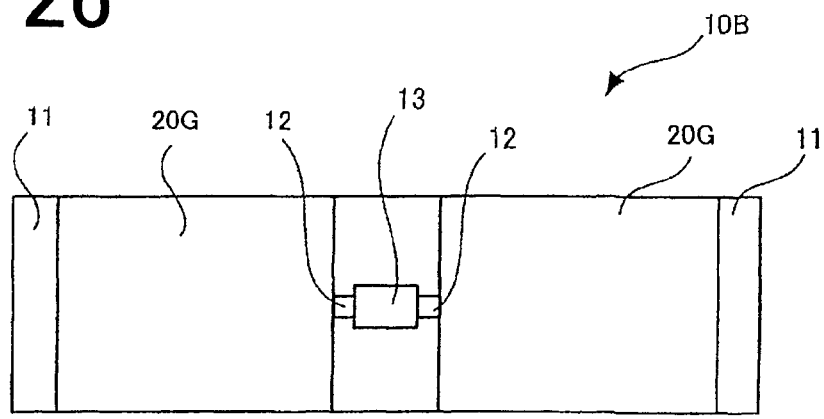
FIG. 26 is a plan view of the RFID tag with the protection sheet attached to the front surface thereof.

FIG. 25 schematically illustrates a step for attaching a protection sheet onto a front surface of the RFID tag formed to the state shown in FIG. 24. FIG. 26 is a plan view of the RFID tag with the protection sheet attached to the front surface thereof.

Referring to FIG. 25, the RFID tag 10B formed to the state shown in FIG. 24 is placed on a stage 41. Then, protection sheets 20G are placed and positioned at opposite sides of the RFID tag 10B that are free of the circuit chip 13 (see FIG. 26). A heater-presser head 42 is placed on the protection sheets 20G to heat and apply pressure on the protection sheets 20G, whereby the protection sheets 20G are fused onto the base 11.

In this manner, an RFID tag in the state shown in FIG. 26 is manufactured.

Although the attaching step of a protection sheet may be completed at this point, the present embodiment also has an attaching step for attaching a protection sheet onto the back surface of the base 11.

Figure 27:
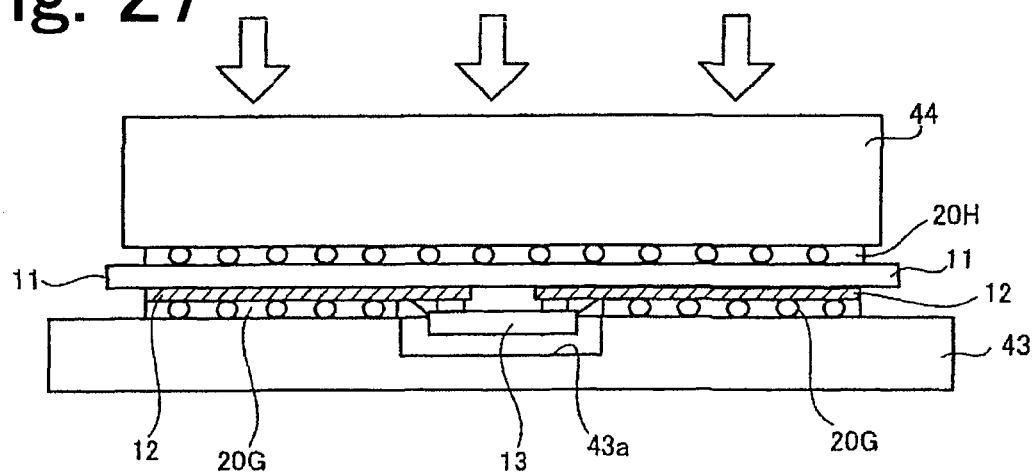
FIG. 27 schematically illustrates a step for attaching a protection sheet onto a back surface of the base.

FIG. 27 schematically illustrates a step for attaching a protection sheet onto the back surface of the base 11.

In this case, the RFID tag in the state shown in FIG. 26 where the protection sheets 20G are attached to the front surface of the base 11 is flipped over and is disposed on a stage 43 that has a recess 43a as shown in FIG. 27 for avoiding interference with the circuit chip 13. A protection sheet 20H is placed and positioned on the back surface of the base 11, and a heater-presser head 44 is placed on the protection sheet 20H so as to heat and apply pressure on the protection sheet 20H. Accordingly, the protection sheet 20H becomes attached to the back surface of the base 11.

Figure 28:
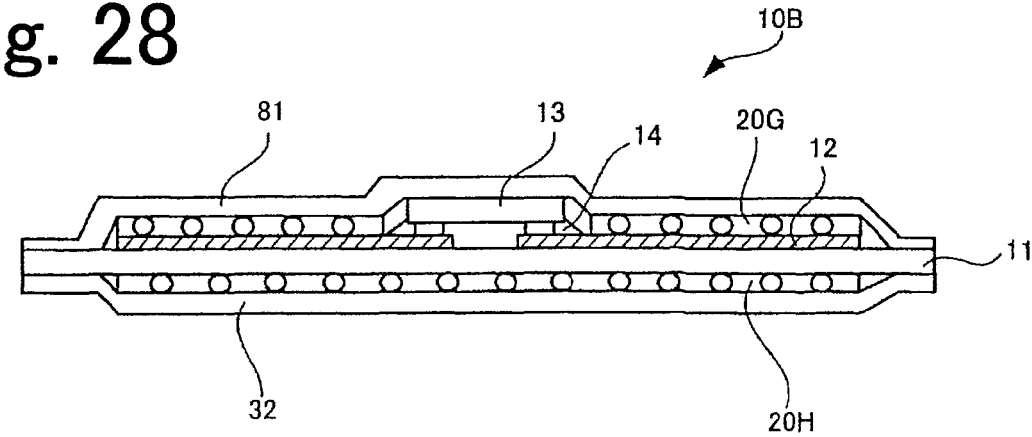
FIG. 28 shows the RFID tag wrapped with a cover sheet.

FIG. 28 shows the RFID tag wrapped with a cover sheet.

In this embodiment, after the protection sheets 20G and 20H are attached to the front and back surfaces of the base 11 as a result of the steps shown in FIGS. 25 to 27, the front surface is coated with a cover sheet 31 for protecting the circuit chip 13, and the back surface has a double-sided adhesive tape 32 adhered thereto, as shown in FIG. 28, so that the RFID tag 10B can be adhered to a product for which the RFID tag 10B is intended to be used. Accordingly, this completes the manufacturing process of the RFID tag 10B.

Due to having flexibility, the RFID tag 10B can be used by being attached to, for example, clothing. In addition, the protection sheets are prevented from being compressed when bent, thereby avoiding excessive bending of the antenna. Consequently, this can prevent the antenna from breaking. Furthermore, the RFID tag 10B is prevented from being bent to an extent that the antenna is bent to an extremely small radius of curvature.

Although the RFID tag 10B shown in FIG. 28 has the protection sheets 20G and 20H attached to the opposite surfaces of the base 11, a configuration in which a protection sheet is attached only to one side of the base 11 adjacent to the antenna 12 (the front surface of the base 11 in the case of FIG. 28) is also permissible.

In the RFID tag according to the present invention, the rigid bodies contained in a protection sheet may be defined by granular bodies dispersedly disposed in the protection sheet. Alternatively, when the base has a shape that extends in a predetermined longitudinal direction, the rigid bodies may be defined by wire rods arranged in the longitudinal direction in the protection sheet and extending in a width direction intersecting with the longitudinal direction.

In the RFID tag according to the present invention, the protection sheet may be disposed above the surface of the base having the circuit chip at a section free of the circuit chip. Alternatively, the protection sheet may be disposed above the surface of the base opposite to the surface thereof having the circuit chip.

The protection sheet according to the present invention is disposed above the base of the RFID tag equipped with the base, a communication antenna disposed on the base, and a circuit chip mounted on the base and electrically connected to the antenna, the circuit chip performing radio communication via the antenna. When the base is bent, the protection sheet protects the antenna to prevent it from breaking. The protection sheet has dispersedly disposed therein rigid bodies that prevent the protection sheet from being compressed when bent.

In the protection sheet according to the present invention, the rigid bodies may be defined by granular bodies dispersedly disposed in the protection sheet. Alternatively, when the base has a shape that extends in a predetermined longitudinal direction, the rigid bodies may be defined by wire rods arranged in the longitudinal direction in the protection sheet and extending in a width direction intersecting with the longitudinal direction.

A first protection sheet manufacturing method according to the present invention is directed to a method for manufacturing a protection sheet disposed above a base of an RFID tag. Specifically, the RFID tag is equipped with the base, a communication antenna disposed on the base, and a circuit chip mounted on the base and electrically connected to the antenna, the circuit chip performing radio communication via the antenna. When the base is bent, the protection sheet protects the antenna to prevent it from breaking. The method includes a rigid-body disposing step for dispersedly disposing rigid bodies on a sheet-like flexible member, the rigid bodies to be used for preventing the flexible member from being compressed when the flexible member is bent after the manufacturing process; and a rigid-body embedding step for embedding the rigid bodies into the flexible member by heating and applying pressure on the flexible member and the rigid bodies dispersedly disposed on the flexible member so that a protection sheet with the rigid bodies dispersedly disposed in the flexible member is manufactured.

In the first manufacturing method, the rigid-body disposing step may be a step for dispersedly disposing the rigid bodies on the flexible member and stacking another flexible member over the dispersedly disposed rigid bodies to sandwich the rigid bodies between the two flexible members.

In the first manufacturing method, the rigid bodies may be defined by granular bodies. In that case, the rigid-body disposing step may be a step for dispersedly disposing the granular bodies on the flexible member. Alternatively, the rigid bodies may be defined by wire rods. In that case, the rigid-body disposing step may be a step for arranging the wire rods on the flexible member in an in-plane direction of the flexible member and in a predetermined one-dimensional direction.

A second protection sheet manufacturing method according to the present invention is directed to a method for manufacturing a protection sheet disposed above a base of an RFID tag. Specifically, the RFID is equipped with the base, a communication antenna disposed on the base, and a circuit chip mounted on the base and electrically connected to the antenna, the circuit chip performing radio communication via the antenna. When the base is bent, the protection sheet protects the antenna to prevent it from breaking. The method includes a stacking step for alternately stacking sheet-like flexible members and layers of rigid bodies by disposing one flexible member at a time and then dispersedly disposing the rigid bodies of one layer on the disposed flexible member in an alternating fashion, the rigid bodies to be used for preventing the flexible members from being compressed when the flexible members are bent after the manufacturing process; a fusion-body forming step for heating and applying pressure on the multilayer body containing the alternately stacked flexible members and rigid bodies to allow the flexible members to be fused with each other so that a fusion body with the rigid bodies embedded in the fused flexible members is formed; and a cutting step for cutting the fusion body to a predetermined thickness so that the aforementioned protection sheet is manufactured.

In the second manufacturing method, the rigid bodies may be defined by granular bodies. In that case, the stacking step may be a step for dispersedly disposing the granular bodies on the flexible members. Alternatively, the rigid bodies may be defined by wire rods. In that case, with regard to dispersedly disposing the rigid bodies on each flexible member, the stacking step may be a step for arranging the wire rods on each flexible member in an in-plane direction of the flexible member and in a predetermined one-dimensional direction.

To persons who have common knowledge in the technical field to which the present invention pertains, the term "RFID tag" used in this specification may also be referred to as an "RFID-tag inlay" as an internal component (inlay) for an "RFID tag", or the term "RFID tag" may also be referred to as a "wireless tag".

The RFID tag according to the present invention is provided with a protection sheet having dispersedly disposed therein rigid bodies that prevent a flexible member from being compressed when bent. Thus, the RFID tag has flexibility while having the capability to prevent an antenna from breaking when the RFID tag is bent. By using the protection sheet according to each of the above embodiments on an RFID tag, the antenna in the RFID tag can be prevented from breaking when the RFID tag is bent, without impairing the flexibility of the RFID tag. With the protection sheet manufacturing methods according to the above embodiments, the protection sheet according to the present invention can be readily manufactured.

What is claimed is:

1. A radio frequency tar comprising: a base; a radio frequency antenna disposed on the base; a circuit chip mounted on the radio frequency antenna and electrically connected to the radio frequency antenna, the circuit chip performing radio communication via the radio frequency antenna; and a protection sheet disposed on the radio frequency antenna, the protection sheet comprising a flexible material and rigid bodies dispersed in the flexible material, wherein each of the rigid bodies has a size being capable of limiting bending of the protection sheet so as to not disconnect the radio frequency antenna from being collapsed when the radio frequency tar is bent and compressed, wherein the rigid bodies are granular bodies dispersed in the flexible material.

2. The radio frequency tag according to claim 1,
wherein the base extends in a predetermined longitudinal direction, the rigid bodies are wire rods arranged in the longitudinal direction in the protection sheet and extending in a width direction perpendicular with the longitudinal direction.

3. The radio frequency tag according to claim 1, further comprising another protection sheet disposed on the surface of the base opposite to the surface thereof mounted the circuit chip on.

4. A method for manufacturing a radio frequency tag, the method comprising the steps of: disposing a radio frequency antenna on a base; mounting and electrically connecting a circuit chip to the radio frequency antenna, the circuit chip performing radio communication via the radio frequency antenna; disposing a flexible material formed of a sheet shape on the radio frequency antenna; dispersing rigid bodies on the flexible material so as to prevent the flexible material from being collapsed when the radio frequency tag is bent and compressed, each of the rigid bodies having a size being capable of limiting bending of the protection sheet so as to not disconnect the radio frequency antenna from being collapsed when the radio frequency tag is bent and compressed; embedding the rigid bodies into the flexible material by heating and applying pressure on the flexible material and the rigid bodies; and heating the two flexible material layers such that the two flexible material layers encase the rigid bodies, wherein the rigid bodies are granular bodies.

5. The method according to claim 4, further comprising the steps of:
stacking an another flexible material on the rigid bodies.

6. The method according to claim 4,
wherein the dispersing step disperses the rigid bodies on the flexible material and stacking another flexible material over the rigid bodies to sandwich the rigid bodies between the flexible material and the another flexible material.

7. The method according to claim 4,
wherein the rigid bodies are wire rods and the dispersing step arranges the wire rods in the longitudinal direction in the protection sheet and extending in a width direction perpendicular with the longitudinal direction.

\* \* \* \* \*